(12) United States Patent
Kopp et al.

(10) Patent No.: US 10,833,224 B2
(45) Date of Patent: Nov. 10, 2020

(54) OPTOELECTRONIC SEMICONDUCTOR CHIP AND METHOD OF PRODUCING AN OPTOELECTRONIC SEMICONDUCTOR CHIP

(71) Applicant: OSRAM OLED GmbH, Regensburg (DE)

(72) Inventors: Fabian Kopp, Tanjung Tokong (MY); Attila Molnar, Gelugor (MY)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/462,483

(22) PCT Filed: Dec. 18, 2017

(86) PCT No.: PCT/EP2017/083317
§ 371 (c)(1),
(2) Date: May 20, 2019

(87) PCT Pub. No.: WO2018/114807
PCT Pub. Date: Jun. 28, 2018

(65) Prior Publication Data
US 2019/0371969 A1    Dec. 5, 2019

(30) Foreign Application Priority Data
Dec. 19, 2016   (DE) .......................... 10 2016 124 847

(51) Int. Cl.
*H01L 33/38*    (2010.01)
*H01L 33/14*    (2010.01)
(Continued)

(52) U.S. Cl.
CPC ............ *H01L 33/382* (2013.01); *H01L 33/14* (2013.01); *H01L 33/387* (2013.01);
(Continued)

(58) Field of Classification Search
CPC ..... H01L 33/382; H01L 33/46; H01L 33/387; H01L 33/405; H01L 33/14; H01L 33/30; H01L 2933/0016
See application file for complete search history.

(56) References Cited

U.S. PATENT DOCUMENTS 9,577,156 B2    2/2017  Totani
9,761,772 B2 *  9/2017  Pfeuffer ............... H01L 33/405
(Continued)

FOREIGN PATENT DOCUMENTS

DE    10 2014 114 674 A1    4/2016
DE    10 2015 107 577 A1    11/2016
(Continued)

OTHER PUBLICATIONS

Notice of Reasons for Rejection dated Jun. 2, 2020, of counterpart Japanese Application No. 2019-520645, along with an English translation.

*Primary Examiner* — Dung A. Le
(74) *Attorney, Agent, or Firm* — DLA Piper LLP (US)

(57) ABSTRACT

An optoelectronic semiconductor chip includes a contact layer that impresses current directly into a first semiconductor region present in direct contact with a current web, the first semiconductor region is an n-side and a second semiconductor region is a p-side of a semiconductor layer sequence, and a second mirror layer is applied directly to a second semiconductor region, a plurality of contact fields and isolator fields are arranged alternately along a longitudinal direction of the current web, in the contact fields, the contact layer is in direct contact with the current web, and the isolator fields are free of the contact layer, and a first mirror layer is located between the current web and the first semiconductor region.

14 Claims, 6 Drawing Sheets

(51) Int. Cl.
*H01L 33/40* (2010.01)
*H01L 33/46* (2010.01)
H01L 33/06 (2010.01)
H01L 33/30 (2010.01)

(52) U.S. Cl.
CPC ............ *H01L 33/405* (2013.01); *H01L 33/46* (2013.01); *H01L 33/06* (2013.01); *H01L 33/30* (2013.01); *H01L 2933/0016* (2013.01); *H01L 2933/0025* (2013.01)

(56) References Cited

U.S. PATENT DOCUMENTS

| | | |
|---|---|---|
| 2012/0241720 A1 | 9/2012 | Totani et al. |
| 2018/0108811 A1 | 4/2018 | Kopp et al. |
| 2019/0103520 A1 | 4/2019 | Kopp et al. |

FOREIGN PATENT DOCUMENTS

| | | |
|---|---|---|
| DE | 10 2016 105 056 A1 | 9/2017 |
| JP | 2016-062970 A | 4/2016 |
| JP | 2016-115920 A | 6/2016 |
| WO | 2016/180779 A1 | 11/2016 |

\* cited by examiner

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of producing the chip.

BACKGROUND

There is a need to provide an optoelectronic semiconductor chip that can be produced efficiently and offers a high luminous efficiency.

SUMMARY

We provide an optoelectronic semiconductor chip including a semiconductor layer sequence having an active layer that generates radiation between a first and a second semiconductor region, a transparent substrate on which the semiconductor layer sequence is located, at least one contact trench extending from a side of the second semiconductor region facing away from the substrate through the active layer into the first semiconductor region, at least one metallic busbar that supplies current to the second semiconductor region on a side of the second semiconductor region facing away from the substrate, a first and a second electrically insulating mirror layer that reflect radiation generated during operation in the active layer, and a metallic current web arranged in the contact trench, that provides a current conduction along the contact trench, and supplies current into the first semiconductor region, wherein the first mirror layer protrudes out of the contact trench over the active layer to a side of the second semiconductor region facing away from the substrate, and a contact layer that impresses current directly into the first semiconductor region is present in direct contact with the current web, the first semiconductor region is an n-side and the second semiconductor region is a p-side of the semiconductor layer sequence, and the second mirror layer is applied directly to the second semiconductor region, a plurality of contact fields and isolator fields are arranged alternately along a longitudinal direction of the current web, in the contact fields, the contact layer is in direct contact with the current web, and the isolator fields are free of the contact layer, and the first mirror layer is located between the current web and the first semiconductor region.

We also provide a method of producing an optoelectronic semiconductor chip including in the specified sequence:
A) providing a transparent substrate and growing a semiconductor layer sequence on the substrate, wherein the semiconductor layer sequence has an active layer that generates radiation between a first and a second semiconductor region,
B) producing a first mask layer on the semiconductor layer sequence and applying a second electrically insulating mirror layer that reflects radiation generated during operation in the active layer in places onto the second semiconductor region,
C) removing the first mask layer and applying a current spreading layer over a whole area for the second semiconductor region,
D) producing a second mask layer on the semiconductor layer sequence and etching at least one contact trench extending from a side of the second semiconductor region facing away from the substrate through the active layer into the first semiconductor region,
E) applying a first electrically insulating mirror layer that reflects radiation generated during operation in the active layer in the contact trench,
F) removing the second mask layer and producing a third mask layer as well as partially removing the first mirror layer and applying a contact layer to impress current directly into the first semiconductor region,
G) removing the third mask layer as well as applying a passivation layer, producing a fourth mask layer and applying a metallic current web in the contact trench, wherein the current web is configured for a current conduction along the contact trench and impresses current into the first semiconductor region so that the first mirror layer protrudes out of the contact trench over the active layer and extends onto a side of the second semiconductor region facing away from the substrate.

LIST OF REFERENCE SIGNS 1 optoelectronic semiconductor chip
2 semiconductor layer sequence
21 first semiconductor region/n-side
22 active layer
23 second semiconductor region/p-side
3 light-transmissive substrate/sapphire
4 contact trench
51 first mirror layer
53 second mirror layer
6 current web for the n-side
61 contact field
62 isolator field
66 bonding region for the n-side
7 contact layer
8 busbar for the p-side
83 current spreading layer for the p-side
88 bonding region for the p-side
9 passivation layer
11 first mask layer for the second mirror layer
12 second mask layer for the contact trench
13 third mask layer for the contact layer
14 fourth mask layer for the current web and the busbar
G growth direction of the semiconductor layer sequence

DETAILED DESCRIPTION

Our optoelectronic semiconductor chip comprises a semiconductor layer sequence. The semiconductor layer sequence comprises one or more active layers that generate radiation, in particular visible light such as blue light. The active layer is located between a first semiconductor region and a second semiconductor region. The first semiconductor region is preferably an n-conducting n-side and the second semiconductor region is in particular a p-conducting p-side. In the following, the first and the second semiconductor regions are respectively explained with this charge carrier conductivity. In the same way, the first and the second semiconductor regions can have the reverse charge carrier conductivities.

The optoelectronic semiconductor chip is preferably a light-emitting diode, LED for short.

The semiconductor layer sequence may be based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or as $Al_nGa_mIn_{1-n-m}As_kP_{1-k}$, wherein in each case $0 \le n \le 1$, $0 \le m \le 1$ and $n+m \le 1$ as well as $0 \le k \le 1$. Preferably, the following applies to at least one layer or to all layers of the semiconductor layer sequence: $0 < n \le 0.8$, $0.4 \le m < 1$ and $n+m \le 0.95$ as well as $0 < k \le 0.5$, wherein the semiconductor layer sequence can have dopants and additional components. For the sake of simplicity, however, only the essential components of the crystal lattice of the semiconductor layer sequence are mentioned, that is Al, As, Ga, In, N or P, even if they can be partially replaced and/or supplemented by small quantities of further substances. The semiconductor layer sequence is particularly preferably based on the material system AlInGaN.

The at least one active layer comprises in particular at least one pn junction and/or at least one quantum well structure. A radiation generated by the active layer during operation has, for example, a wavelength of maximum intensity of at least 400 nm or 425 nm and/or of at most 480 nm or 800 nm.

The semiconductor layer sequence may be located on a translucent substrate. The substrate is light-permeable, preferably transparent, in particular for radiation generated in the active layer. The semiconductor layer sequence may furthermore preferably be grown directly on the substrate so that the substrate is a growth substrate. For example, the substrate is a silicon carbide substrate, a gallium nitride substrate, a silicon substrate or preferably a sapphire substrate.

In this example, the first semiconductor region is located closer to the substrate than the second semiconductor region. The active layer is preferably oriented perpendicular to a growth direction of the semiconductor layer sequence and perpendicular to a main side of the substrate, on which the semiconductor layer sequence is applied.

The semiconductor chip may have one or more contact trenches. The at least one contact trench extends from a side of the second semiconductor region remote from the substrate through the active layer into the first semiconductor region. Via the contact trench, the first semiconductor region can be electrically contacted from a side of the second semiconductor region facing away from the substrate.

The semiconductor chip may have a first and a second mirror layer. The two mirror layers are preferably electrically insulating. Furthermore, the mirror layers reflect radiation generated in the active layer during operation. The mirror layers can each be formed from a single layer or can each be composed of a plurality of partial layers. Such partial layers preferably follow one another directly along the growth direction of the semiconductor layer sequence. In particular, the mirror layers are each a dielectric mirror or distributed Bragg reflector, DBR for short.

The semiconductor chip may comprise one or more current webs. The at least one current web is preferably a metallic web. This means, in particular, that the current web consists of one or more metals and is ohmically electrically conductive.

The current web may be partially or completely located in the contact trench. Viewed in a plan view, the current web preferably lies completely within the contact trench. In the direction parallel to the growth direction of the semiconductor layer sequence, the current web can lie completely in the contact trench. Preferably, the current web projects beyond the contact trench and the semiconductor layer sequence projects in the direction away from the substrate.

The current web may be configured to conduct current along the contact trench. The first semiconductor region can be supplied with electric current via the current web. The current web preferably has a length along a longitudinal direction exceeding a mean width of the current web by at least a factor of 10 or 20 or 30 and/or by at most a factor of 200 or 100 or 50. In other words, the current web is shaped in an elongated manner. For example, the current web has dimensions of approximately 3 µm×500 µm.

The current web may have a plurality of contact fields and a plurality of isolator fields along the longitudinal direction. The contact fields and the isolator fields may be arranged alternately in succession. In the isolator fields, no current is impressed from the current web into the semiconductor layer sequence. In contrast, the contact fields supply current to the semiconductor layer sequence, that is, to the first semiconductor region. Thus, no current is impressed into the second semiconductor region along the entire length of the current web.

An electrical contact layer may be present in each of the contact fields. The contact layer can be produced from a single layer or can be composed of a plurality of partial layers. The contact layer is preferably a metallic layer consisting of one or more metals. Alternatively, it is possible for the contact layer to additionally comprise one or more transparent conductive oxides such as indium-tin oxide or consist of one or more such oxides.

The contact layer may be located directly on the first semiconductor region and is configured to impress current directly into the first semiconductor region. In particular, the first semiconductor region is supplied with current exclusively via the contact layer so that no current is impressed into the first semiconductor region by other components of the semiconductor chip.

The contact layer may be attached directly to the current web. This means that a current flow takes place via the current web to the contact layer and from the latter into the first semiconductor region. The contact layer is preferably limited to the respective contact field. A connection between adjacent contact fields thus does not take place by a material of the contact layer itself, but electrically directly preferably exclusively via the current web. The term 'electrically directly' preferably relates to an ohmic conductive connection so that an electrically conductive connection via the semiconductor layer sequence is not to be regarded as a direct electrical connection.

The isolator fields may be free of the contact layer. In particular, the contact layer is limited to the contact fields. One of the mirror layers is located in the isolator fields, in particular the first mirror layer, between the current web and the first semiconductor region. In other words, an electrical insulation of the current web from the first semiconductor region through the associated mirror layer takes place in the isolator fields.

The optoelectronic semiconductor chip may comprise a semiconductor layer sequence having an active layer that generates radiation, wherein the active layer is located between a first and a second semiconductor region. The semiconductor layer sequence is located on a transparent substrate. At least one contact trench extends from a side of the second semiconductor region remote from the substrate through the active layer into the first semiconductor region. First and second electrically insulating mirror layers reflect radiation generated in the active layer during operation. A metallic current web is applied in the contact trench, conducts current along the contact trench and energizes the first semiconductor region. The first mirror layer extends out of the contact trench beyond the active layer up to a side of the second semiconductor region facing away from the substrate. A contact layer impresses current directly into the first semiconductor region and directly contacts the current web.

One of the most-produced types of light-emitting diodes are so-called "sapphire volume emitters". In such devices, a semiconductor layer sequence based on AlInGaN is grown on a sapphire substrate. The light-emitting diodes generate blue light emitted via side surfaces of the substrate and via an upper side of the substrate facing away from the semiconductor layer sequence. Metal contacts for current injection are located on the semiconductor layer sequence. Further layers are preferably located between an underside of the metal contacts facing the semiconductor layer sequence and the semiconductor layer sequence, for example, mirror layers or current spreading layers. Such light-emitting diodes are used, for example, to generate white light in combination with a phosphor such as YAG:Ce.

In such light-emitting diodes, the higher a reflection coefficient at the electrical metal contacts, the lower the absorption at the contacts and thus brightness losses. Furthermore, the more photo layers are used in the production process of the optoelectronic semiconductor chip, in particular to increase the reflection coefficients at the contacts, the higher production costs arise.

With our semiconductor chips and methods, a high reflection at the electrical contacts can be achieved on the one hand and, on the other hand, only four photo layers are required to produce the semiconductor chip. This results in a semiconductor chip having a high light output efficiency at comparatively low production cost.

This is achieved in particular by the mirror layer applied to side surfaces and a base surface of the contact trench. The contact layer is located only at local openings in the base area of the contact trench. The contact layer can be produced without an additional photo layer. Such a contact layer having a preferably relatively high reflection can also be located on the contacts for the second semiconductor region to enable an overall high reflection at the contacts.

The semiconductor chip may comprise one or more busbars, also referred to as current rails. The at least one busbar is preferably formed from one or more metals and is ohmically conductive. In other words, the busbar can be a metallic rail. The busbar energizes the second semiconductor region on a side of the second semiconductor region facing away from the substrate.

The second mirror layer may be applied directly to the second semiconductor region. In particular, the second mirror layer is applied exclusively to the second semiconductor region. The second mirror layer is preferably limited to regions in which the busbar is arranged. This applies, for example, with a tolerance of at most 5 μm or 10 μm or 20 μm, in a plan view of the optoelectronic semiconductor chip.

The contact layer may additionally be present in a region between the busbar and the second semiconductor region. The contact layer is preferably applied directly to the second mirror layer. Viewed in a plan view, the second mirror layer projects laterally around the contact layer, in particular all around. That is, in plan view, the contact layer can be completely covered by the second mirror layer and can thus be located within the second mirror layer. Furthermore, the busbar preferably projects laterally beyond the contact layer, viewed in a plan view.

The contact layer may be composed of exactly two or exactly three or exactly four partial layers. In particular, a semiconductor contact layer is present, which is located directly on the first semiconductor region and preferably formed by exactly one layer. The semiconductor contact layer preferably comprises one or more of the following materials or consists of one or more of these materials: Cr, Ag, Mo, Ni, Ti, ZnO, ITO. Furthermore, a thickness of the semiconductor contact layer is preferably at least 0.1 nm or 0.5 nm or 1 nm and/or at most 5 nm or 30 nm or 100 nm.

The contact layer may comprise a reflection layer. The reflection layer preferably follows the semiconductor contact layer directly and is preferably formed by exactly one layer. In particular, the contact layer consists of the reflection layer together with the semiconductor contact layer. Furthermore, the reflection layer and the semiconductor contact layer are preferably arranged congruently one above the other. The reflection layer preferably comprises one or more of the following materials or consists of one or more of these materials: Ag, Al, Al:Cu, Rh, Pd, Pt, TCO layer such as ITO. A thickness of the reflection layer is preferably at least 10 nm or 20 nm or 30 nm and/or at most 100 nm or 200 nm or 500 nm.

The contact layer may contain a barrier layer. The barrier layer is preferably mounted directly on the reflection layer, on a side facing away from the semiconductor layer sequence. The optional barrier layer is preferably a metal layer. In particular, the barrier layer comprises one or more of the following materials or consists of one or more of these materials: Ti, Pt, Au, Ni, Rh, Ru. The thickness of the barrier layer is preferably at least 1 nm or 4 nm or 20 nm and/or at most 200 nm or 100 nm. The barrier layer is preferably composed of two partial layers, for example, a Ti partial layer and a Pt partial layer, but can also have more than two partial layers.

The busbar may be U-shaped when viewed in a plan view. This means that, viewed in a plan view, the busbar preferably forms an arc with an angular coverage of 180°, wherein the busbar is bent more strongly in a middle part than at end regions, and the busbar can run out straight in the end regions. Alternatively, the busbar can also have other shapes and, for example, can be L-shaped, H-shaped and m-shaped or fork-shaped with two or more than two fingers.

The current web may be located between the limbs of the U of the busbar. In particular, the current web can lie completely within the U of the busbar. If the busbar has other shapes, the current web can also be located within the busbar. In addition, it is alternatively possible that the busbar and the current web are each of L-shaped configuration and lie next to one another or that the busbar and the current web, as seen in plan view, are shaped in a fork-like or m-like manner with fingers or prongs engaging into one another.

The semiconductor chip, in particular with regard to the electrical contacting, may be designed symmetrically with respect to a longitudinal axis, along which the current web runs. The longitudinal axis is in particular the axis of symmetry or the axis of the semiconductor chip that is the longest. It is possible for the longitudinal axis to be the single axis of symmetry of the semiconductor chip as seen in plan view.

The current web may project beyond the contact layer at least in places, viewed in a plan view. This applies in particular in the direction perpendicular to the longitudinal direction of the current web. Furthermore, this preferably applies within at least one or all of the contact fields. In particular, the current web extends over the contact layer laterally in the relevant contact field.

The contact layer may project laterally or completely beyond the current web, viewed in plan view and in the direction perpendicular to the longitudinal direction of the current web. In other words, the contact layer is wider than the current web in at least one or in all contact fields.

The current web may be located in places or entirely laterally next to the contact layer. This applies in plan view and the direction perpendicular to the longitudinal direction of the current web. In other words, the current web can be located completely or partially adjacent to the contact layer when viewed in plan view. This applies to one, for a plurality of or to all of the contact fields.

The first mirror layer may extend out of the contact trench beyond the active layer onto a side of the second semiconductor region facing away from the substrate. In particular, the mirror layer may touch this side. That, the first mirror layer partially covers the base area of the contact trench, preferably in direct contact. Viewed in cross section, side surfaces of the contact trench can be completely or predominantly covered by the first mirror layer, wherein the mirror layer is in turn preferably applied directly to the side surfaces. The base area of the contact trench is preferably completely covered by the first mirror layer together with the contact layer. A degree of coverage of the second semiconductor region with the first mirror layer is preferably at most 10% or 5% or 2% and/or at least 0.5% or 1%.

The semiconductor chip may comprise a passivation layer. The passivation layer can be formed from a single layer or from a plurality of partial layers. Preferably, the first and the second mirror layer are each partially covered by the passivation layer. The passivation layer can extend in a continuous and uninterrupted manner as a common layer over the two mirror layers. Recesses for the current web and the busbar are preferably provided in the passivation layer. Regions of the first and second mirror layers not covered by the passivation layer are preferably covered by the current web together with the busbar. In particular, the mirror layers and/or the contact layer are not exposed at any point.

The contact layer need not touch the passivation layer. That is, the contact layer may be spaced apart from the passivation layer. Alternatively, the contact layer can touch the passivation layer in places.

A proportion of the contact fields on the current web along the longitudinal direction may be at least 20% or 25% or 30% or 40%. Alternatively or additionally, this proportion may be at most 70% or 60% or 55% or 45% or 35%. In particular, this proportion of the contact fields is smaller than the corresponding proportion of the isolator fields.

The current web may have a constant width across the contact fields and the isolator fields along the longitudinal direction. That is, the current web can extend in particular as a straight line without a width variation along the contact trench. Equally, the contact trench for the current web can have a not varying, constant width and/or cross-sectional shape. The contact trench also preferably runs along a straight line. Alternatively, it is possible for the current web and/or the contact trench to have a varying width. The width then increases, for example, in the direction away from the bonding region, continuously or stepwise, or the width varies periodically, for example, sinusoidally.

The first mirror layer may be located closer to the substrate than the second mirror layer. It is possible that the first mirror layer is located on average closer to the second mirror layer or that the second mirror layer is in total further away from the substrate than the first mirror layer.

The mirror layers need not overlap each other when viewed in a plan view. That is, the mirror layers need not be arranged one above the other at any point along the growth direction of the semiconductor layer sequence.

The second mirror layer may be applied only outside of depressions of the semiconductor layer sequence. In particular, the second mirror layer may be located on the second semiconductor region as it is grown. At the points at which the second mirror layer is applied, no material has thus been removed from the semiconductor layer sequence. In particular, the contact trench is free of the second mirror layer.

The mirror layers may be constructed differently from one another. This can mean that the mirror layers have different materials, material compositions and/or layer thicknesses.

The first and second mirror layer may be of the same structure. In particular, the two mirror layers then have the same material compositions and identical layer sequences and the same layer thicknesses. However, the mirror layers are applied in different process steps.

Our method preferably produces an optoelectronic semiconductor chip, as specified in connection with one or more of the above-mentioned examples. Features of the method are therefore also disclosed for the optoelectronic semiconductor chip and vice versa.

The method may be configured to produce an optoelectronic semiconductor chip and comprise the following steps, particularly preferably in the order specified:

A) providing a light-transmissive substrate and growing a semiconductor layer sequence onto the substrate, wherein the semiconductor layer sequence has an active layer that generates radiation between a first and a second semiconductor region, B) producing a first mask layer on the semiconductor layer sequence and applying a second electrically insulating mirror layer that reflects radiation generated during operation in the active layer in places on the second semiconductor region, C) removing the first mask layer and whole-area application of a current spreading layer for the second semiconductor region, D) producing a second mask layer on the semiconductor layer sequence and etching at least one contact trench extending from a side of the second semiconductor region remote from the substrate through the active layer into the first semiconductor region, E) applying a first electrically insulating mirror layer in the contact trench to reflect radiation generated in the active layer during operation, F) removing the second mask layer and producing a third mask layer and partially removing the first mirror layer and applying a contact layer to impress current directly into the first semiconductor region, and G) removing the third mask layer, applying a passivation layer, producing a fourth mask layer, and applying a metallic current web in the contact trench for current conduction along the contact trench and to energize the first semiconductor region so that the first mirror layer extends out of the contact trench beyond the active layer to a side of the second semiconductor region facing away from the substrate.

With this method, production of the optoelectronic semiconductor chip with only exactly four photo layers is possible, corresponding to the first to fourth mask layers.

In a step D1) between steps D) and E), the current spreading layer may be etched, preferably wet-chemically etched. In this example, the second semiconductor region is partially freed from the current spreading layer at the edge of the contact trench. In this example, the second mask layer is undercut so that an etched region of the current spreading layer extends to below the second mask layer. A projection of the second semiconductor region beyond the current spreading layer in the direction towards the contact trench, after the etching of the current spreading layer, is preferably at least 0.3 µm or 0.7 µm and/or at most 10 µm or 5 µm.

Our optoelectronic semiconductor chip and method are explained in more detail below with reference to the drawings on the basis of examples. Identical reference signs indicate the same elements in the individual figures. However, no relationships to scale are illustrated. Rather, individual elements can be represented with an exaggerated size to afford a better understanding.

Figure 1:
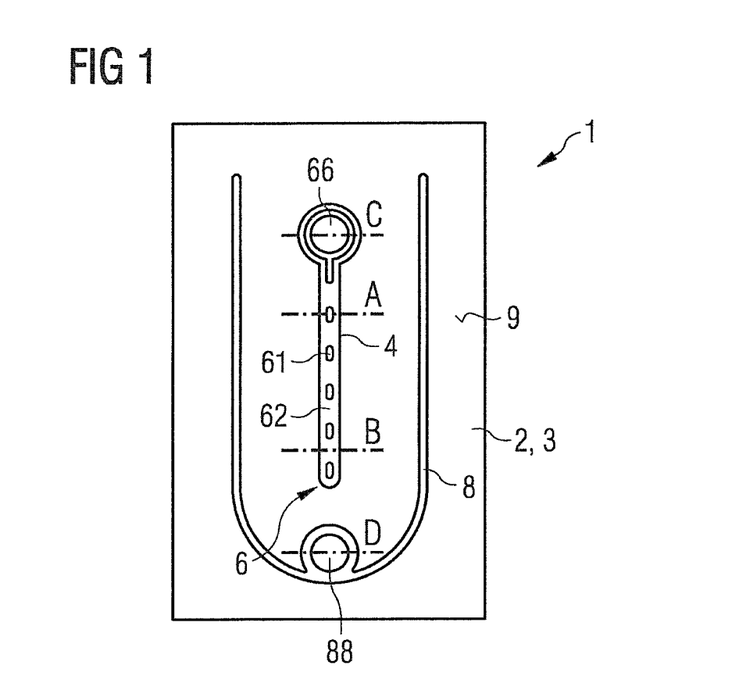
FIG. 1 shows a schematic plan view of an example of an optoelectronic semiconductor chip.
Figure 2:
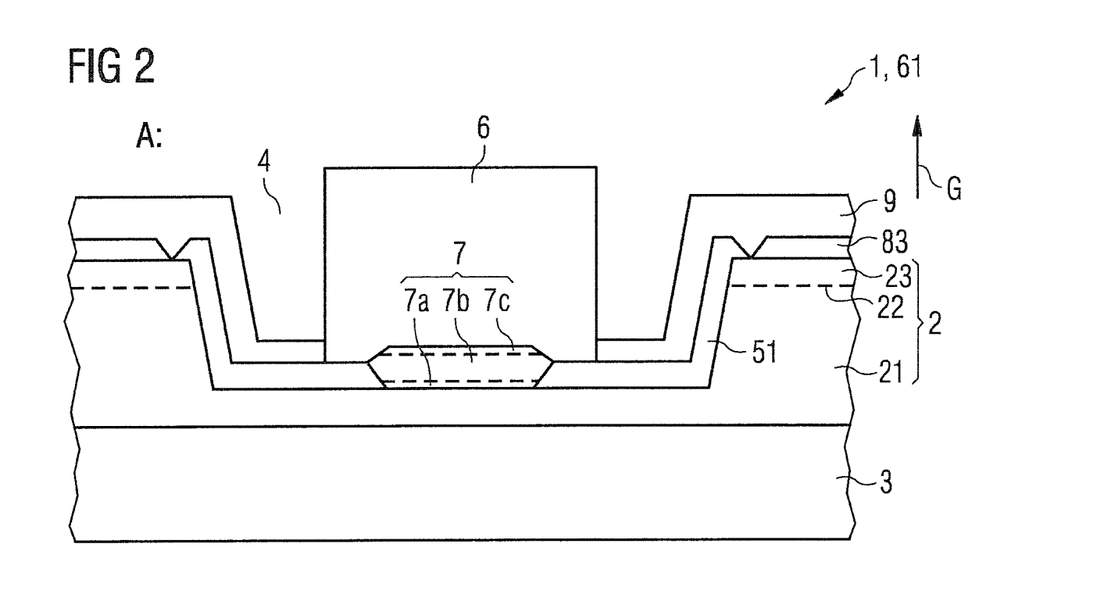
FIGS. 2 to 7 show schematic sectional representations of examples of optoelectronic semiconductor chips.
Figure 3:
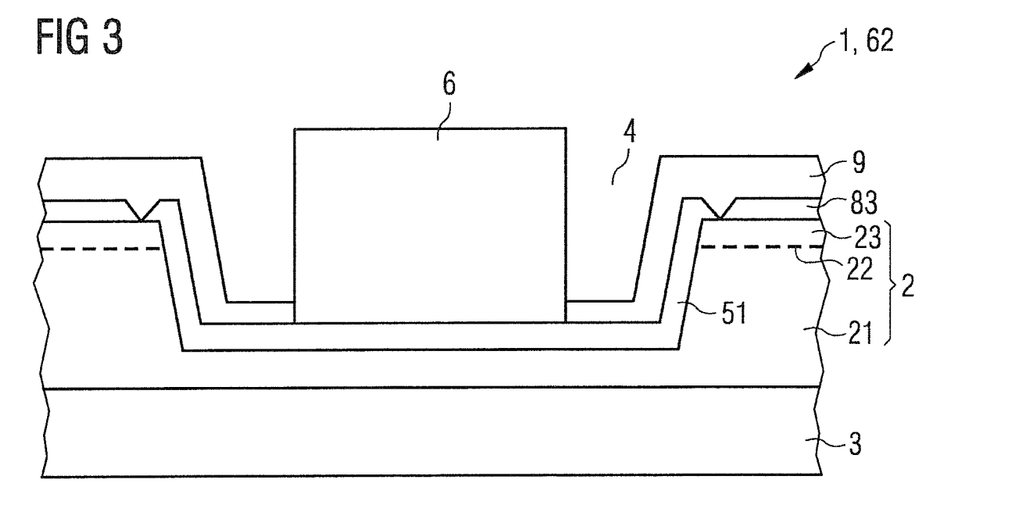
Figure 4:
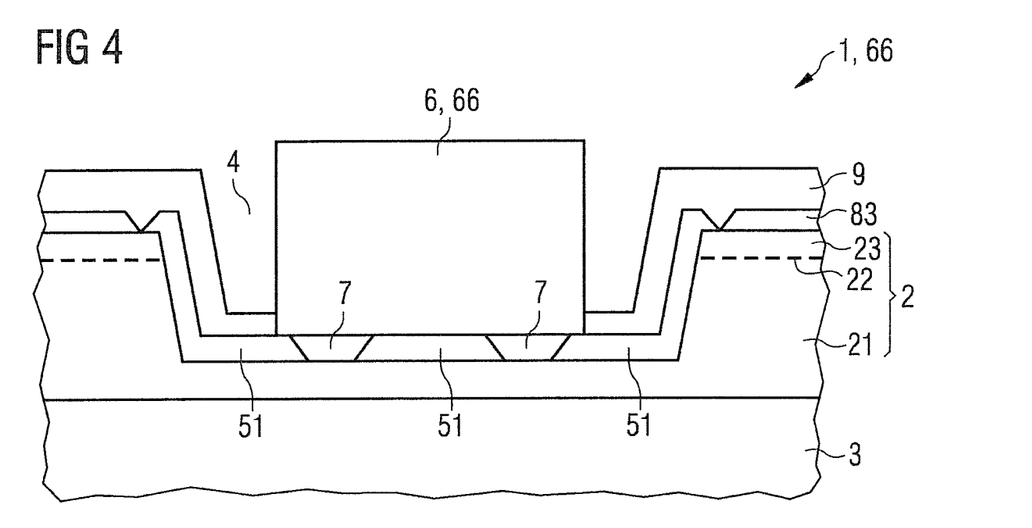

FIG. 1 shows an example of an optoelectronic semiconductor chip 1. In FIG. 1, four regions A, B, C, D are marked. FIGS. 2 to 4 show sectional representations of these regions A, B, C, D. The semiconductor chip 1, in particular a light-emitting diode chip, comprises a semiconductor layer sequence 2 on a light-transmissive substrate 3. The semiconductor layer sequence 2 is preferably based on AlInGaN. The substrate 3 is preferably a sapphire growth substrate. During operation, the semiconductor chip 1 preferably generates blue light.

A current web 6 having a bonding region 66 and a busbar 8 having a bonding region 88 are provided to energize the semiconductor chip 1. The current web 6 is located in a contact trench 4, seen in plan view. Along a longitudinal direction, the current web 6 alternately has directly successive contact fields 61 and isolator fields 62. A current impression into the semiconductor layer sequence 2 is effected via the current web 6 only in the contact fields 61. In a plan view, the busbar 8 is U-shaped and the current web 6 with the bonding region 66 is located completely within this U.

FIG. 2 shows the sectional view of the region A from FIG. 1 that forms one of the contact fields 61. The semiconductor layer sequence 2 comprises an active layer 22, for example, a multi-quantum well structure located between a first semiconductor region 21 and a second semiconductor region 23. The first semiconductor region 21 is preferably an n-side and the second semiconductor region 23 is a p-side of the semiconductor layer sequence 2.

The contact trench 4 for the current web 6 is formed in the semiconductor layer sequence 2. The contact trench 4 extends from a side of the second semiconductor region 23 remote from the substrate 3 through the active layer 22 into the first semiconductor region 21. A first mirror layer 51 is located in the contact trench 4 extending from a base area of the contact trench 4 via side areas of the contact trench 4 to the second semiconductor region 23. In this example, the first mirror layer 51 covers only a very small part of the second semiconductor region 23. Remaining regions of the second semiconductor region 23 are covered by a current spreading layer 83. Furthermore, a passivation layer 9 is present. Together with the current web 6, the passivation layer 9 completely covers the semiconductor layer sequence 2 in the region illustrated in FIG. 2.

In addition, a contact layer 7 is arranged between the first semiconductor region 21 and the current web 6 and directly adjoins the contact layer 7 and the first semiconductor region 21. Thus, the contact layer 7 is located in an opening of the first mirror layer 51. The contact layer 7 can slightly cover the first mirror layer 51 at the edges thereof. In a lateral direction, perpendicular to a growth direction G of the semiconductor layer sequence 2, the current web 6 projects beyond the contact layer 7. The contact layer 7 is thus completely surrounded by the first semiconductor region 21 together with the first mirror layer 51 and the current web 6.

Optionally, as in all other examples, it is possible for the contact layer 7 to consist of a semiconductor contact layer 7a, a reflection layer 7b and a barrier layer 7c. The thin semiconductor contact layer 7a is formed, for example, from titanium or chromium. The reflection layer 7b is, for example, a comparatively thick layer of Ag, Al or Rh. The barrier layer 7c contains or consists in particular of titanium or platinum.

The current web 6 is formed, for example, from silver, copper, gold, tin and/or nickel. The electrically insulating first mirror layer 51 is preferably a multi-layer mirror designed as a DBR (distributed Bragg reflector). The first mirror layer 51 preferably comprises a comparatively low number of layers, in particular at least two or three or four partial layers. Alternatively or additionally, the first mirror layer 51 comprises at most 20 or 12 or six partial layers. Thus, the first mirror layer 51 preferably has a sequence of dielectric layers having a low and a high refractive index, respectively. Low refractive index means, in particular, <1.7, high refractive index means in particular >1.7, at a wavelength of maximum intensity of the radiation generated in the semiconductor layer sequence 2 during operation. In relation to this wavelength, a thickness of the individual layers is preferably $\lambda/4$, wherein a lowermost of these layers, closest to the substrate 3, can have a thickness of $3\lambda/4$.

In the region B from FIG. 1, shown in FIG. 3, no contact layer is present. The electrically insulating first mirror layer 51 extends continuously between the current web 6 and the semiconductor layer sequence 2 so that no current is impressed into the semiconductor layer sequence 2 in the isolator field 62.

FIG. 4 shows a sectional view of the region C from FIG. 1. The contact layer 7 is ring-shaped when viewed in plan view. Furthermore, the contact layer 7 is completely covered by the current web 6. The contact layer 7 encloses a circular region of the first mirror layer 51. For the rest, the same applies as described in FIG. 2.

Figure 5:
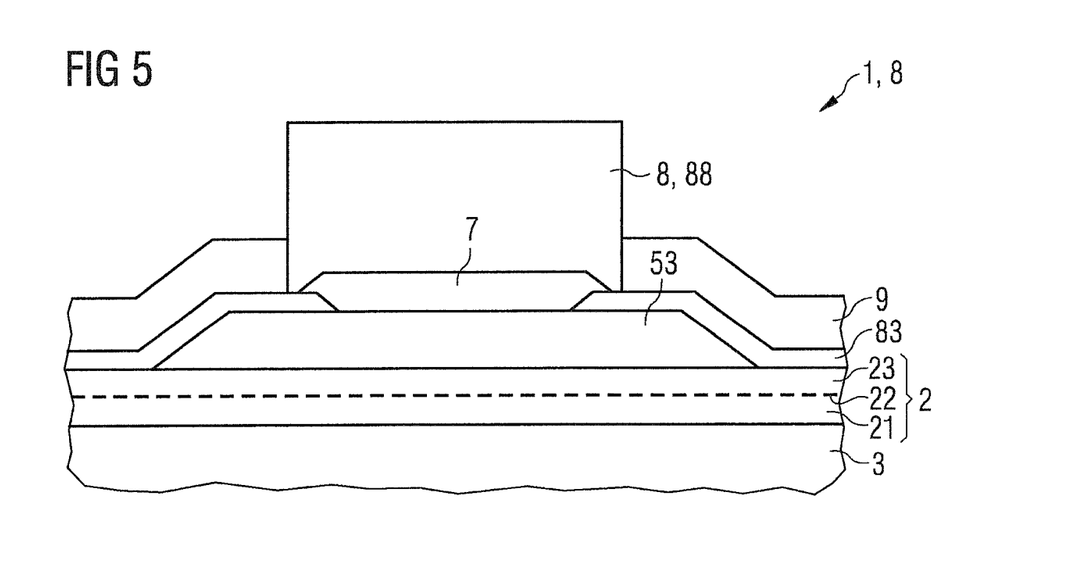

The region D from FIG. 1 can be seen in FIG. 5. A second mirror layer 53 is present directly on the second semiconductor region 23 in the area of the busbar 8. The second mirror layer 53 can be constructed in exactly the same way as the first mirror layer 51. Accordingly, reference is made to the statements relating to the first mirror layer 51.

The current spreading layer 83 is located on the second mirror layer 53. The current spreading layer 83 is formed, for example, from ITO and has a thickness of approximately 80 nm. The busbar 8 is located directly on the current spreading layer 83. During operation, a current distribution takes place across the surface of the semiconductor chip 1 by the busbar 8. Subsequently, a further current spreading takes place via the current spreading layer 83. The busbar 8 is preferably formed from the same materials and with the same thickness as the current web 6.

Outside the bonding region 88, as illustrated in FIG. 5, in the U-shaped arms the busbar 8 is preferably constructed in exactly the same way as illustrated in FIG. 5, but with a reduced width.

Optionally, the contact layer 7 is located between the second mirror layer 53 and the busbar 8. This can apply across the entire busbar 8 or only for the bonding region 88. The contact layer 7 is laterally overhung by the busbar 8 and the bonding region 88.

A corresponding configuration of the busbar 8, as shown in conjunction with FIG. 5, is preferably also present in all other examples.

Figure 6:
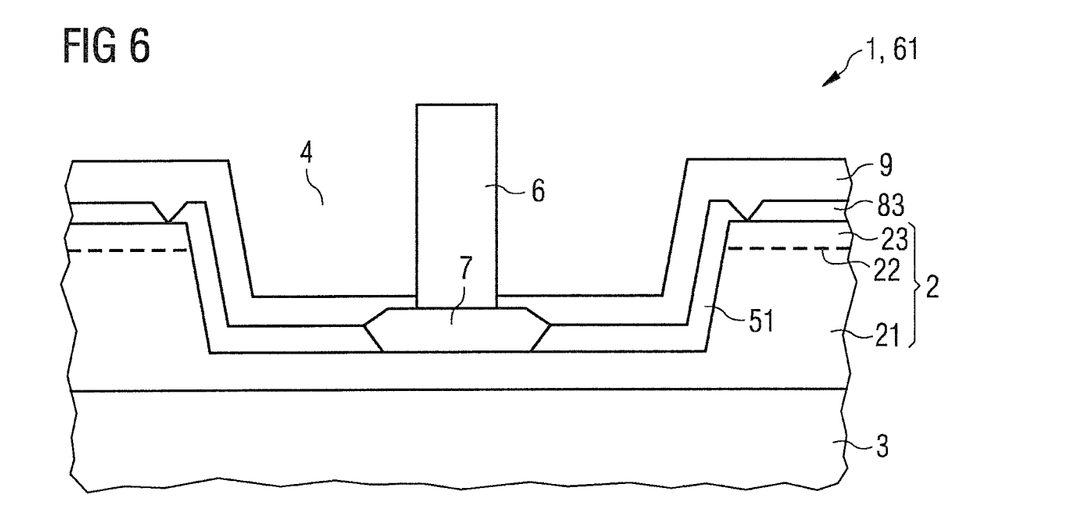

FIG. 6 illustrates a further example of the semiconductor chip 1. In this example, only one contact field 61 is shown. The remaining regions of the semiconductor chip 1 can be configured, while taking account of the modification from FIG. 6, analogously to FIGS. 1 to 5.

According to FIG. 6, the current web 6 has a smaller width than the contact layer 7. As in FIG. 2, the contact layer 7 and the current web 6 are arranged symmetrically with respect to one another. The contact layer is thus in direct contact with the passivation layer 9 in places. Together with the current web 6, the passivation layer 9 completely covers the contact layer 7 in the region illustrated. The contact layer 7 is formed from a reflecting metal and is opaque, as is also preferable in FIGS. 1 to 5.

The passivation layer 9 is, as preferred also in all other examples, formed from an electrically insulating material and is tight for moisture and/or oxygen. In particular, the passivation layer 9 is a combination of an inner layer of aluminum oxide, for instance applied by atomic layer deposition, and an outer layer of silicon dioxide located further away from the substrate 3, for instance applied by chemical vapor deposition.

Figure 7:
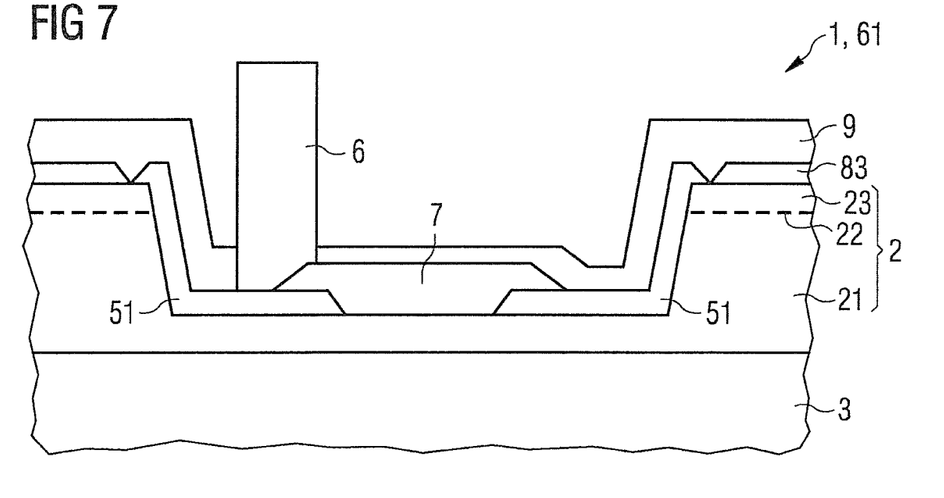

In the example of the semiconductor chip 1 according to FIG. 7, the current web 6 is arranged centrally with respect to the contact layer 7. The current web 6 is preferably narrower than the contact layer 7. In this example, the current web 6 can be located completely adjacent to the opening in the first mirror layer 51, in which the contact layer is in direct contact with the first semiconductor region 21. A current flow takes place via the current web 6 to the contact layer 7 and then into the first semiconductor region 21. Due to this arrangement, at least the largest part of the area of the current web 6 is shielded from incident light by the first mirror layer 51.

In this example, the contact layer 7 is preferably made of a transparent material such as a transparent conductive oxide, in particular ITO so that incident light is not significantly absorbed neither at the current web 6 nor in the contact layer 7. A lateral extent of the contact layer 7 is thus greater than the opening in the first mirror layer 51. By this arrangement, a particularly high light output efficiency can be achieved.

FIGS. 8A-8G illustrate an example of a production method for such an optoelectronic semiconductor chip 1. According to FIG. 8A, the semiconductor layer sequence 2 is grown on the substrate 3. A first mask layer 11 is applied and is structured. The second mirror layer 53 is applied in the regions not covered by the first mask layer 11.

Figure 8A:
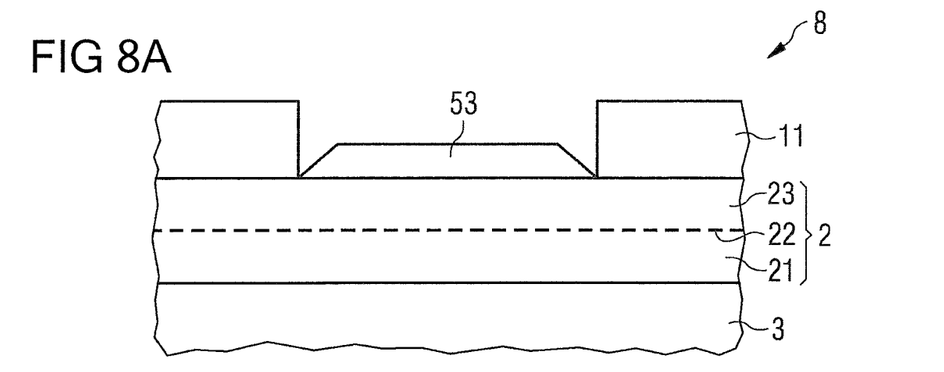
FIGS. 8A-8G show schematic sectional representations of method steps of our production method for an optoelectronic semiconductor chip.
Figure 8B:
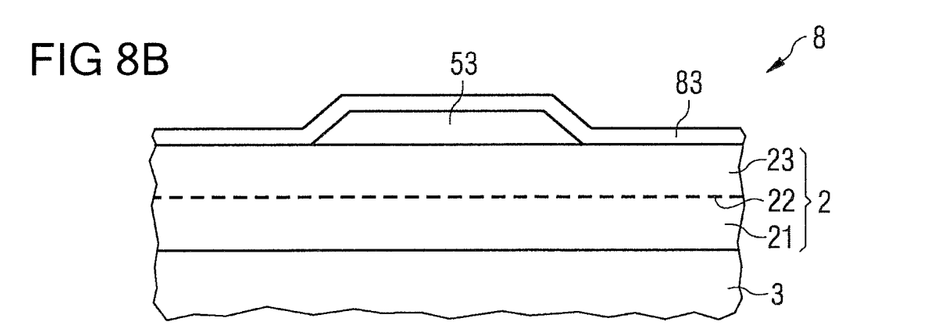

Subsequently, as shown in FIG. 8B, the first mask layer 11 is removed and the current spreading layer 83, for example, of ITO, is applied over the whole area.

Figure 8C:
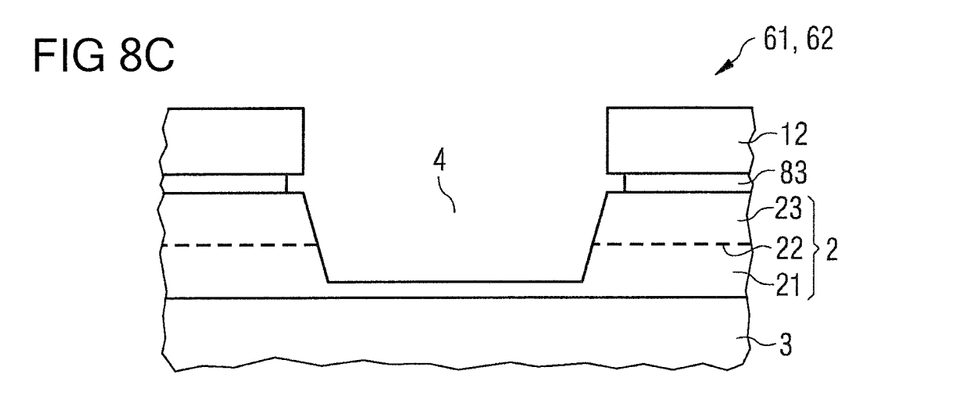

Thereupon, as shown in FIG. 8C, a second mask layer 12 is produced and structured. The contact trench 4 is etched with the aid of the second mask layer 12. As a result, the current spreading layer 83 is also removed in the region of the contact trench 4. In addition, wet-chemical etching of the current spreading layer 83 takes place, wherein the second mask layer 12 can remain intact during this wet-chemical etching. The current spreading layer 83 is etched back selectively from the edges of the contact trench 4 so that the second semiconductor region 23 is exposed at the edge of the contact trench 4. For example, the second semiconductor region 23 projects beyond the current spreading layer 83 by approximately 1 μm, in the direction of the contact trench 4.

Figure 8D:
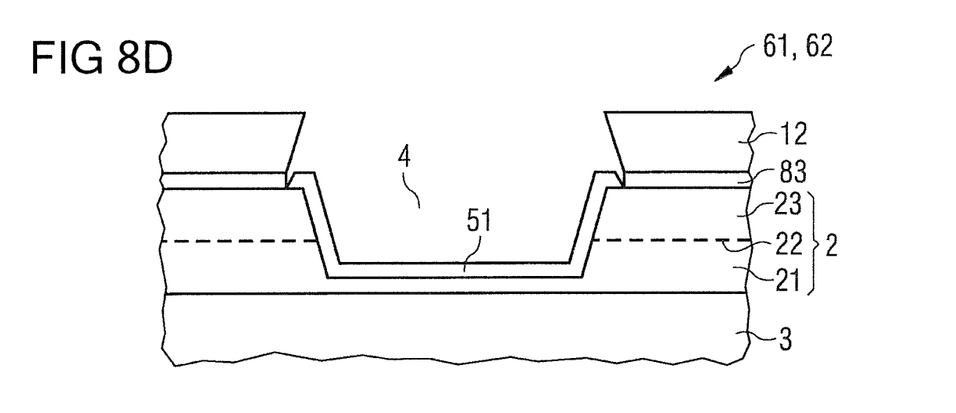

Subsequently, the first mirror layer 51 is produced in the contact trench 4, with the aid of the same second mask layer 12 as shown in FIG. 8D. Prior to application of the first mirror layer 51, a plasma treatment can be carried out, for example, with oxygen plasma that locally removes the second mask layer 12 on the side of the second semiconductor region 23 facing away from the substrate 3. Consequently, the first mirror layer 51 can subsequently slightly cover this side of the second semiconductor region 23.

The second mask layer 12 covers the second mirror layer 53 as shown in FIG. 8B, preferably completely, so that the second mirror layer 53 is not affected by the production of the contact trench 4.

Figure 8E:
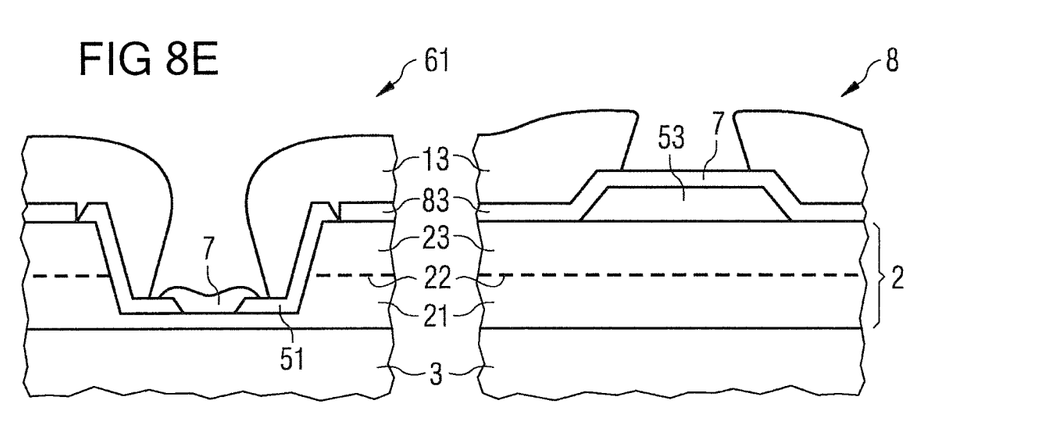

According to FIG. 8E, a third mask layer 13 is applied after removal of the second mask layer 12. With the aid of the third mask layer 13, the first mirror layer 51 is opened locally in the contact trench 4 and optionally the second mirror layer 53 is opened locally in the region determined for the busbar 8, cf. also FIG. 5. The contact layer 7 is subsequently applied.

A wet-chemical or dry-chemical etching can be used to open the mirror layers 51, 53. If the mirror layer or the layers 51, 53 has/have a multi-layer structure, dry-chemical etching is advantageously carried out to produce smooth side flanks since wet-chemical etching rates of different dielectrics usually differ from one another. After this opening of the mirror layers 51, 53, a plasma can optionally be generated, for example, an oxygen plasma to partially remove the third mask layer 13. The opening in the third mask layer 13 thus increases so that the opening is enlarged towards the semiconductor layer sequence 2 and sides of the mirror layers 51, 53 facing away from the substrate 3 are partially freed. This is advantageous to increase the extent of the contact layer 7 to make contact with the current web 6 laterally offset with respect to the opening as also shown in FIG. 7.

Optionally, the contact layer 7 is also produced on the second mirror layer 53 in the opened current spreading layer 83.

Figure 8F:
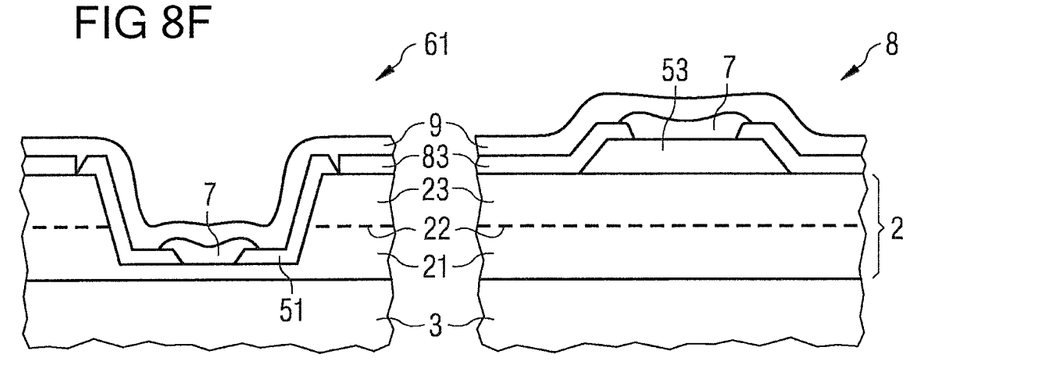

According to FIG. 8F, the third mask layer 13 has been removed and the passivation layer 9 is applied over the entire surface. The passivation layer is preferably composed of a first applied $Al_2O_3$ layer and a subsequently applied $SiO_2$ layer to be particularly impermeable to moisture.

Figure 8G:
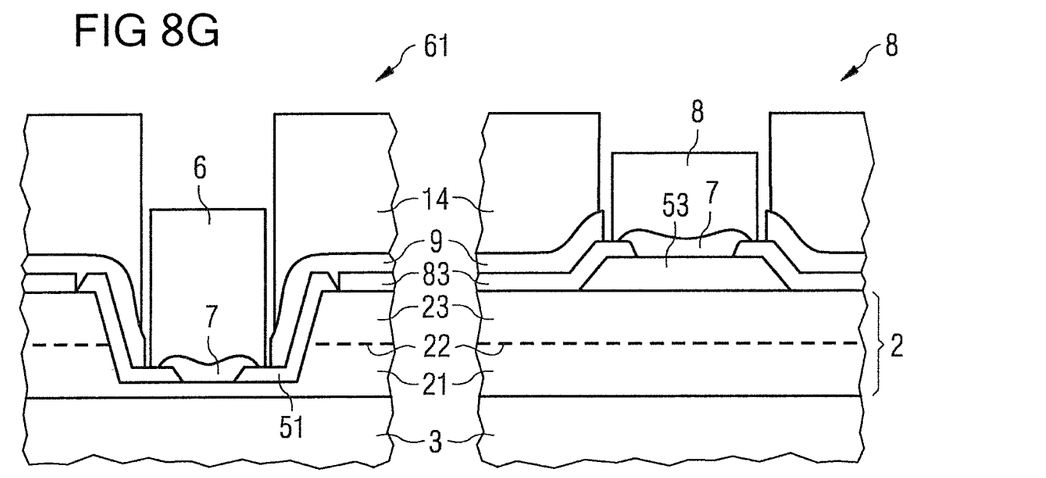

Finally, as shown in FIG. 8G, a fourth mask layer 14 is applied. With the aid of the fourth mask layer 14, the passivation layer 9 is removed in places and, preferably in the same method step, the current web 6 and the busbar 8 are produced. The fourth mask layer 14 is then removed.

The components shown in the figures follow, unless indicated otherwise, preferably in the specified sequence directly one on top of the other. Layers not in contact in the figures are spaced apart from one another. If lines are drawn parallel to one another, the corresponding surfaces are likewise oriented parallel to one another. If not indicated otherwise, the relative thickness ratios, length ratios and positions of the drawn components relative to one another are correctly reproduced in the figures.

The chips and methods described herein are not restricted by the description on the basis of the examples. Rather, this disclosure encompasses any new feature and also any combination of features including in particular any combination of features in the appended claims, even if the feature or combination itself is not explicitly specified in the claims or examples.

This application claims priority of DE 10 2016 124 847.9, the subject matter of which is incorporated herein by reference.

The invention claimed is:

1. An optoelectronic semiconductor chip comprising:
a semiconductor layer sequence having an active layer that generates radiation between a first and a second semiconductor region,
a transparent substrate on which the semiconductor layer sequence is located,
at least one contact trench extending from a side of the second semiconductor region facing away from the substrate through the active layer into the first semiconductor region,
at least one metallic busbar that supplies current to the second semiconductor region on a side of the second semiconductor region facing away from the substrate,
a first and a second electrically insulating mirror layer that reflect radiation generated during operation in the active layer, and
a metallic current web arranged in the contact trench, that provides a current conduction along the contact trench, and supplies current into the first semiconductor region,
wherein
the first mirror layer protrudes out of the contact trench over the active layer to a side of the second semiconductor region facing away from the substrate, and
a contact layer that impresses current directly into the first semiconductor region is present in direct contact with the current web,
the first semiconductor region is an n-side and the second semiconductor region is a p-side of the semiconductor layer sequence, and the second mirror layer is applied directly to the second semiconductor region,
a plurality of contact fields and isolator fields are arranged alternately along a longitudinal direction of the current web,
in the contact fields, the contact layer is in direct contact with the current web, and the isolator fields are free of the contact layer, and
the first mirror layer is located between the current web and the first semiconductor region.

2. The optoelectronic semiconductor chip according to claim 1, wherein
in a region between the busbar and the second semiconductor region, the contact layer is additionally applied directly to the second mirror layer, and
the second mirror layer laterally projects beyond the contact layer, seen in plan view.

3. The optoelectronic semiconductor chip according to claim 1, wherein
the busbar is U-shaped when viewed in a plan view and the current web is located between limbs of said U, and
the semiconductor chip, viewed in a plan view, is configured symmetrically with respect to a longitudinal axis along which the current web runs.

4. The optoelectronic semiconductor chip according to claim 1, wherein the current web surrounds the contact layer at least in places, viewed in plan view and in the direction perpendicular to the longitudinal direction of the current web.

5. The optoelectronic semiconductor chip according to claim 1, wherein the contact layer laterally projects beyond the current web at least in places, viewed in plan view and in the direction perpendicular to the longitudinal direction of the current web.

6. The optoelectronic semiconductor chip according to claim 1, wherein the current web is arranged, at least in places, laterally next to the contact layer, seen in plan view and in the direction perpendicular to the longitudinal direction of the current web.

7. The optoelectronic semiconductor chip according to claim 6, wherein, in the regions in the contact fields in which the current web extends laterally next to the contact layer, the current web is located completely on the first mirror layer, seen in plan view and in the direction perpendicular to the longitudinal direction of the current web.

8. The optoelectronic semiconductor chip according to claim 1, wherein the first mirror layer covers the side of the second semiconductor region facing away from the substrate to at most 5%.

9. The optoelectronic semiconductor chip according to claim 1, wherein the first and the second mirror layers are partially surrounded by a common passivation layer and remaining regions of the first and second mirror layers are covered by the current web together with the busbar.

10. The optoelectronic semiconductor chip according to claim 9, wherein the contact layer consists of one or more metals and is spaced apart from the passivation layer.

11. The optoelectronic semiconductor chip according to claim 1, wherein
a proportion of the contact fields at the current web along the longitudinal direction is 20% to 70%, and
the current web has a constant width along the longitudinal direction across the contact fields and the isolator fields.

12. The optoelectronic semiconductor chip according to claim 1, wherein
the first mirror layer is closer to the substrate than the second mirror layer,
the mirror layers do not overlap each other, but are of the same configuration, and
the second mirror layer is applied only outside of depressions of the semiconductor layer sequence.

13. A method of producing an optoelectronic semiconductor chip comprising in the specified sequence:
A) providing a transparent substrate and growing a semiconductor layer sequence on the substrate, wherein the semiconductor layer sequence has an active layer that generates radiation between a first and a second semiconductor region,
B) producing a first mask layer on the semiconductor layer sequence and applying a second electrically insulating mirror layer that reflects radiation generated during operation in the active layer in places onto the second semiconductor region,
C) removing the first mask layer and applying a current spreading layer over a whole area for the second semiconductor region,
D) producing a second mask layer on the semiconductor layer sequence and etching at least one contact trench extending from a side of the second semiconductor region facing away from the substrate through the active layer into the first semiconductor region,
E) applying a first electrically insulating mirror layer that reflects radiation generated during operation in the active layer in the contact trench,
F) removing the second mask layer and producing a third mask layer as well as partially removing the first mirror layer and applying a contact layer to impress current directly into the first semiconductor region,
G) removing the third mask layer as well as applying a passivation layer, producing a fourth mask layer and applying a metallic current web in the contact trench, wherein the current web is configured for a current conduction along the contact trench and impresses current into the first semiconductor region so that the first mirror layer protrudes out of the contact trench over the active layer and extends onto a side of the second semiconductor region facing away from the substrate.

14. The method according to claim 13, wherein in a step D1) between steps D) and E), the current spreading layer is etched wet-chemically, and the second mask layer is undercut so that an etching region of the current spreading layer extends to below the second mask layer, and the second semiconductor region is exposed at the edge of the contact trench.

* * * * *